United States Patent [19]
Cao et al.

[11] Patent Number: 6,023,183
[45] Date of Patent: Feb. 8, 2000

[54] VOLTAGE CONVERSION CIRCUIT AND METHOD

[75] Inventors: Tai Anh Cao; Khanh Tuan Vu Nguyen; Hieu Trong Ngo, all of Austin, Tex.

[73] Assignee: International Business Machines Corporation, Armonk, N.Y.

[21] Appl. No.: 09/094,906

[22] Filed: Jun. 15, 1998

[51] Int. Cl.[7] ........................................ H03L 5/00
[52] U.S. Cl. ................................. 327/333; 327/404
[58] Field of Search ........................... 327/314, 315, 327/325, 333, 404, 437, 94, 554, 318, 319, 320, 321, 327, 328; 326/80, 81, 83, 68, 113, 121

[56] References Cited

U.S. PATENT DOCUMENTS

| | | | |
|---|---|---|---|
| 3,947,727 | 3/1976 | Stewart | 361/91 |
| 4,309,664 | 1/1982 | Fellows | 328/140 |
| 5,394,028 | 2/1995 | Feddeler et al. | 327/544 |
| 5,541,534 | 7/1996 | Tai Cao et al. | |
| 5,663,663 | 9/1997 | Tai Cao et al. | |
| 5,666,082 | 9/1997 | Wilenken et al. | 327/404 |
| 5,781,034 | 7/1998 | Rees et al. | 326/86 |

*Primary Examiner*—Toan Tran
*Assistant Examiner*—Quan Tra
*Attorney, Agent, or Firm*—Russell D. Culbertson; Anthony V. S. England

[57] ABSTRACT

A voltage converter circuit (10) includes a primary P-type FET (20) having its source-drain conduction path connected between an input (22) and a first output node (23). An N-type FET (21) is connected in parallel with the primary P-type device (20) between the input (22) and first output node (23). The gate electrode of the primary P-type device (20) is connected to the first output node (23) while the gate electrode of the N-type device (21) is connected to a second voltage supply at the voltage level of a desired second voltage signal. A first digital signal at a first voltage level is applied to the input (22). The voltage produced at the first output node (23) equals the desired second voltage level and comprises the input signal voltage reduced by the threshold voltage of the primary P-type device (20). One or more additional P-type devices (40) may be connected in series with the primary P-type device (20) to reduce the output voltage level further.

11 Claims, 4 Drawing Sheets

VOLTAGE CONVERSION CIRCUIT AND METHOD

TECHNICAL FIELD OF THE INVENTION

The present invention relates in general to voltage converters, and in particular, to a circuit for converting digital signals from one signal voltage level to another.

BACKGROUND OF TH INVENTION

Metal-oxide semiconductor ("MOS") technology is now preferred in manufacturing many semiconductor devices and circuits. Complementary MOS ("CMOS") circuitry is often a preferred technology for implementing integrated circuits because of the low power dissipation in CMOS circuitry.

CMOS technology advances have been characterized by a lowering of the power supply voltage required to activate the CMOS circuitry. Various CMOS technologies require 5 volt, 3.6 volt, 2.5 volt, and 1.8 volt power supplies. Circuits produced with each of these different CMOS technologies produce a digital signal at a voltage level approximately equal to the supply voltage. Thus, for example, a 3.6 volt CMOS circuit will provide digital signals with a "high" signal level of approximately 3.6 volts while a 2.5 volt CMOS circuit will provide digital signals having a "high" level of approximately 2.5 volts.

A CMOS circuit designed for operation at one power supply voltage level generally might not accept digital signals produced by a higher voltage CMOS circuit. One reason for this incompatibility is that higher voltage CMOS signals may be too high to be safely applied to the thin metal oxide gate of the MOS devices included in the lower voltage CMOS circuit. The higher voltage input signal may damage the lower voltage CMOS circuit or cause it to malfunction.

However, certain computer system designs may utilize many CMOS chips requiring different power supply voltages. In this mixed CMOS situation, the output signals from one CMOS circuit are not directly compatible with the input signal requirements of another CMOS circuit in the system. Therefore, the signals from a higher voltage CMOS circuit in a system must be converted to a level acceptable to a second, lower voltage CMOS circuit which may require an input from the higher voltage circuit.

One prior art arrangement for converting a digital signal to a lower voltage signal comprised an N-type transistor having its source-drain conduction path connecting an input and an output. The input was connected to receive a signal at one voltage level and the output provided signals at the desired lower voltage level. The gate of the N-type device was connected to receive a supply voltage at the desired lower voltage signal level. In this single N-type device conversion arrangement, the maximum voltage at the output was limited to the saturation voltage of the device, that is, the voltage at the gate of the N-type device minus the threshold voltage of the N-type device.

In a 1.8 volt CMOS system, the "high" signal level VIH may range from 1.8 volts to 1.4 volts while the "low" signal level VIL may range from 0.4 volts to 0 volts. Where the prior art N-type conversion circuit was used to convert from a higher voltage signal level to a 1.8 volt system signal, and assuming a threshold voltage for the N-type device of 0.4 volts, the maximum voltage at the output of the N-type conversion circuit was 1.8 volts minus 0.4 volts (1.4 volts). This maximum 1.4 volt output from the prior art conversion circuit just met the VIH of the 1.8 volt system. However, with a 10% tolerance, the power supply voltage for the 1.8 volt system may fall to 1.62 volts. At this minimum power supply level, the maximum voltage output of the N-type conversion circuit equalled 1.62 volts minus 0.4 volts (1.22 volts). This maximum 1.22 volt output from the prior art conversion circuit was below the VIH of the 1.8 volt system. Thus, the prior art N-type conversion arrangement was unacceptable for use in converting to a 1.8 volt system signal. Furthermore, the threshold voltage did not scale well as the power supply and device size became smaller and smaller. That meant that the threshold voltage became a larger and larger part of the power supply in terms of percentage.

SUMMARY OF THE INVENTION

It is an object of the invention to provide a voltage level conversion circuit which overcomes the above-described problems and others associated with prior digital signal conversion circuits. The invention also encompasses a method for converting digital signals from one voltage level to a second level.

These objects are accomplished with a circuit comprising two transistors connected in parallel between an input and a first output node. One transistor comprises a primary P-type device having its source-drain conduction path connected between the input and the first output node. The second transistor comprises an N-type device in parallel with the P-type device. The P-type device is biased with the voltage at its drain electrode. The N-type device is biased with a supply voltage at the level of the desired second voltage level signal.

When a "high" signal at the first voltage level is applied at the input, both the primary P-type device and the N-type device conduct to increase the voltage at the first output node. The voltage at the first output node rises until both the primary P-type device and the N-type device become nonconductive. The N-type device becomes almost nonconductive first due to its lower saturation voltage, followed by the P-type device which has a somewhat higher saturation voltage. When the P-type device becomes almost nonconductive, the voltage at the first output node equals the input voltage reduced by the threshold voltage VT of the P-type device. Thus the P-type device may be selected so that its threshold voltage equals the amount by which the input voltage must be reduced to produce a signal at the desired second voltage level. Additional P-type devices may be connected in series with the primary P-type device each biased with the signal at its respective drain electrode. The additional P-type devices each serve to reduce the output node voltage further by the amount of their respective threshold voltage.

The voltage level conversion circuit according to the invention may also include a feedback arrangement for speeding the development of the desired second voltage level at the first output node. The feedback arrangement includes a feedback P-type device and a feedback inverter for inverting the voltage signal at the first output node. The feedback P-type device couples the first output node to a supply voltage at the desired second voltage signal level and is biased by the output of the feedback inverter. In this form of the invention the output from the inverter circuit may be inverted again to provide an output signal at the desired second voltage level in phase with the input signal at the first voltage level.

The circuit according to the invention has several advantages over prior voltage conversion arrangements. First, the higher voltage level signal is not applied to any gate of a device adapted to operate at the second, lower voltage level. Second, the conversion circuit dissipates very little power in performing the voltage level conversion. The voltage converter circuit according to the invention responds quickly to the incoming signal and accurately reduces the first voltage level input to the second voltage level.

These and other objects, advantages, and features of the invention will be apparent from the following description of the preferred embodiments, considered along with the accompanying drawings.

DESCRIPTION OF THE PREFERRED EMBODIMENTS

Figure 1:
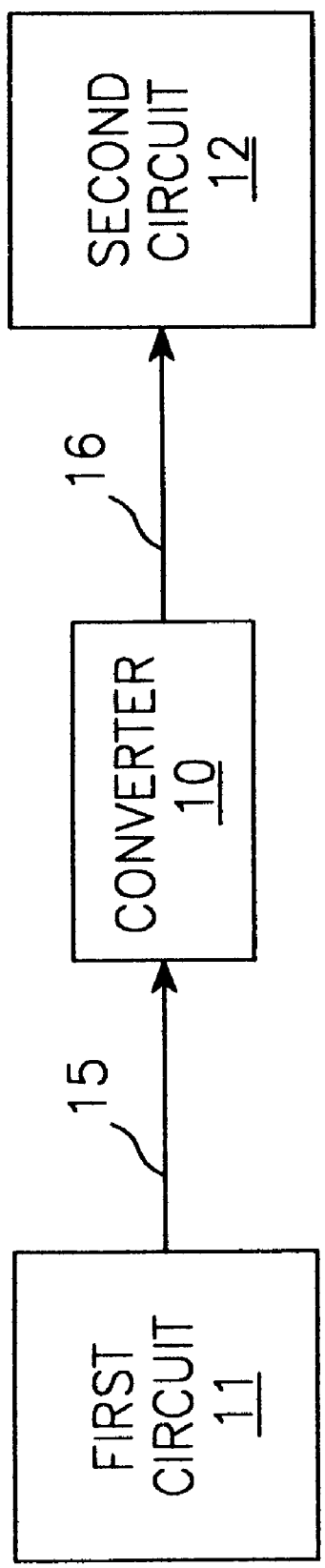
FIG. 1 is a diagrammatic representation of a system utilizing a voltage level converter circuit embodying the principles of the invention.

Referring to FIG. 1, a voltage level converter circuit 10 according to the invention is interposed between a first circuit 11 and a second circuit 12. The first circuit 11 operates at a first supply voltage level and provides a digital signal at line 15 at a voltage level substantially equal to the first supply voltage level. The second circuit 12 operates at a second supply voltage level and requires the digital signal input at line 16 having a voltage level substantially equal to the second supply voltage level. The converter circuit 10 according to the invention operates to convert the first voltage level signal from first circuit 11 to a second voltage level signal at line 16 for use by second circuit 12.

For example, the first supply voltage level utilized by first circuit 11 may be approximately 2.5 volts, while the second supply voltage level utilized by second circuit 12 may be approximately 1.8 volts. In this example, the digital signals at line 15 may include a "low" level which may be 0.1 volts or below, and a "high" level which may range from 2.4 volts to 2.5 volts. Also in this example, the digital signals at line 16 may include a "low" level of approximately 0.4 volts or below, and a "high" level between 1.4 volts and 1.8 volts. These voltage signal levels are used in certain systems including chips utilizing a 1.8 volt power supply and are given here only for purposes of example. The converter circuit 10 according to the invention may be used with many different first and second voltage levels.

The circuits 10, 11, and 12 shown in FIG. 1 may be implemented in many different fashions. The most common implementation may be to have converter 10 and second circuit 12 on one chip (the receiving chip) and to have first circuit 11 on another chip (the sending chip). In some situations, first circuit 11, second circuit 12, and converter 10 may each be implemented on separate integrated circuit chips. The invention as defined in the accompanying claims encompasses each of these implementations.

Figure 2:
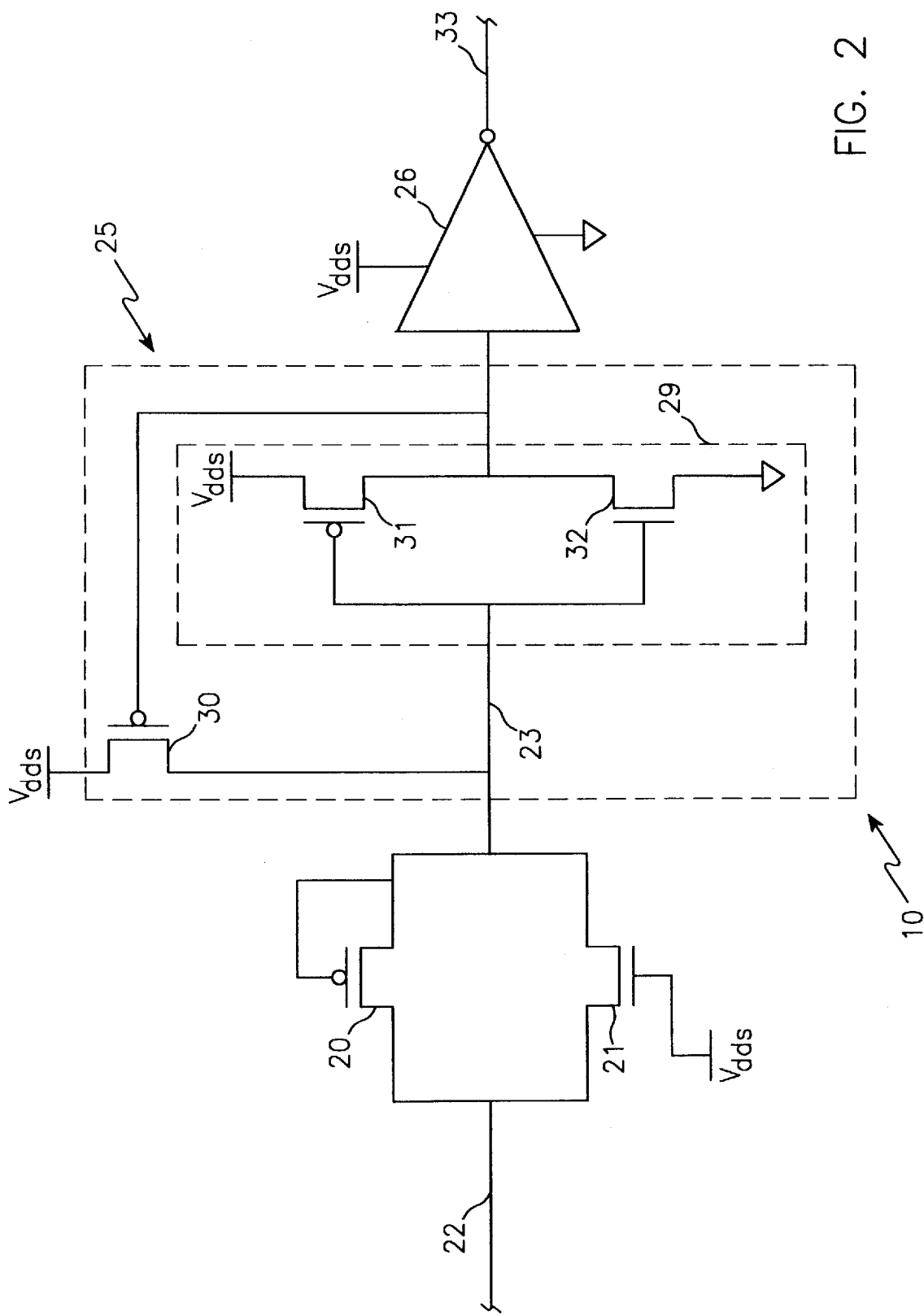
FIG. 2 is an electrical schematic diagram illustrating one preferred embodiment of the converter circuit.

Referring to FIG. 2, one preferred embodiment of the converter circuit 10 comprises primary P-type transistor 20 (a field effect transistor or "FET") and N-type FET 21. The devices 20 and 21 are connected in parallel between an input 22 and a first output node 23. Input 22 is connected to line 15 shown in FIG. 1 and receives signals at the first voltage level from first circuit 11. The illustrated form of the invention shown in FIG. 2 also includes an inverting feedback arrangement 25 and a second inverter 26. Inverter 26 operates at the second supply voltage level $V_{dds}$ and its output provides the output of the voltage level converter circuit 10 and is connected to line 16 in FIG. 1. For faster signals, node 23 may be tapped as the output and may be connected to line 16 in FIG. 1.

The source electrode of primary P-type device 20 is connected to input 22 while its drain electrode is connected to first output node 23. The signal at the drain electrode of P-type device 20 is also fed back to the gate electrode of the device. The drain electrode of N-type device 21 is connected to input 22, while the source electrode is connected to first output node 23. N-type device 21 also has its gate electrode connected to a second or receiver supply voltage $V_{dds}$ which comprises a voltage at the level of the signals desired for use by the second circuit 16 in FIG. 1, that is, the second voltage level.

The inverting feedback arrangement 25 comprises a feedback inverter 29 and a feedback P-type device 30. Feedback inverter 29 includes P-type device 31 and N-type device 32 coupled together between the second supply voltage and ground. The input of feedback inverter 29 is connected to first output node 23, while the feedback inverter output is connected to the input of second inverter 26. The feedback P-type device 30 has its gate electrode connected to the output of feedback inverter 29. The source-drain conduction path of feedback P-type device 30 couples first output node 23 to the second supply voltage $V_{dds}$.

Figure 3:
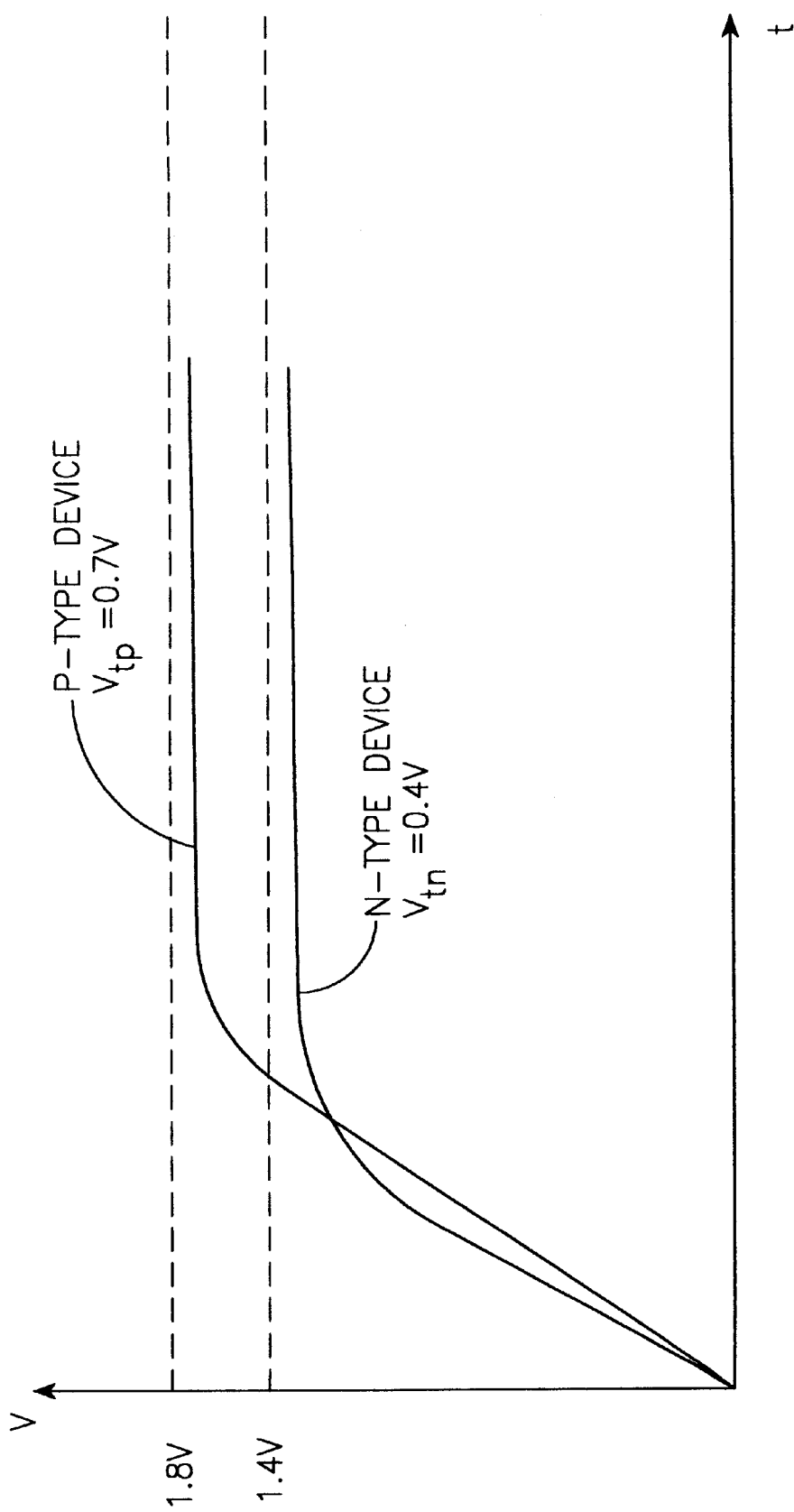
FIG. 3 is a graph illustrating the behavior of the P-type and N-type devices used in the converter circuit shown on FIG. 1.

The operation of circuit 10 shown in FIG. 2 may be described from a starting point at which a "low" signal is applied at input 22 resulting in a "low" signal at first output node 23. This "low" signal will commonly be near zero volts in both the first digital signals used and produced by the first circuit 11, and the second digital signals used by the second circuit 12. When the high going edge of the "high" first voltage level signal is applied at input 22, N-type device 21 is biased to conduct as is primary P-type device 20. Referring to both FIGS. 2 and 3, N-type device 21 ceases conducting substantially when the voltage at the first output node 23 reaches the saturation voltage of the device, 1.8 minus $V_{tn}$ where $V_{tn}$ is the threshold voltage of N-type device 21. Assuming the threshold voltage of N-type device 21 is 0.4 volts, the device ceases conducting substantially when a 1.4 volt signal develops at node 23 ($V_{dds}-V_{tn}$, or 1.8–0.4 volts). Primary P-type device 20 will continue to conduct after N-type device 21 becomes substantially nonconductive and until the voltage at first output node 23 reaches the saturation voltage of P-type device 20. The saturation voltage of P-type device 20 equals the input voltage minus the threshold voltage $V_{tp}$ of the P-type device. In the example listed above in which the first circuit 11 (FIG. 1) operates at 2.5 volts and the second circuit 12 operates at 1.8 volts, the threshold voltage $V_{tp}$ of P-type device 20 equals 0.7 volts. In this example, P-type device 20 limits the voltage at node 23 to 1.8 volts, the input voltage (2.5 volts) minus $V_{tp}$ (0.7 volts).

N-type device 21 is included in the circuit 10 for passing a "low" level signal from first circuit 11 to second circuit 12 (FIG. 1). When a "low" voltage level signal is applied at input 22 following a "high" level signal, N-type device 21 allows the charge at node 23 to discharge rapidly through input 22.

As the voltage at first output node 23 increases to the switching level of feedback inverter 29 the output of the feedback inverter goes to its "low" level which is approximately zero volts. This "low" level at the output of feedback inverter 29 is fed back to feedback P-type device 30 to bias the device into a conducting condition, coupling first output node 23 directly to the second supply voltage $V_{dds}$. The output 33 of the converter circuit 10 comprises the output from the second inverter 26. The second inverter 26 inverts the signal from feedback inverter 29 to produce an output at 33 which is substantially in phase with the input signal.

Those skilled in the art will readily appreciate that converter circuit 10 shown in FIG. 2 may be operated without feedback arrangement 25. In this form of the invention, first output node 23 provides the output for the converter circuit. Eliminating the inverting feedback arrangement 25 also obviates the need for second inverter 26.

Figure 4:
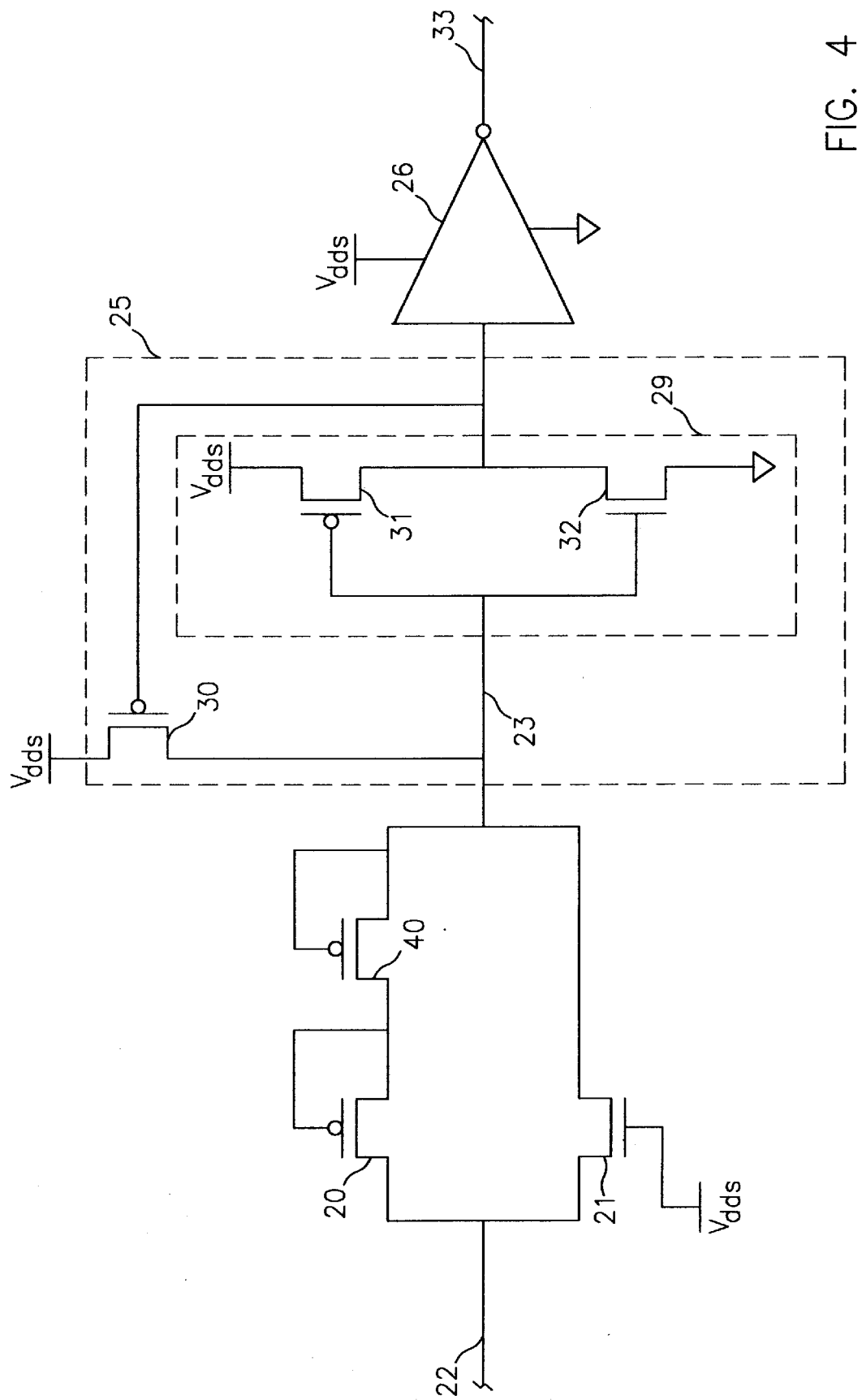
FIG. 4 is an electrical schematic diagram illustrating an alternate form of the converter circuit according to the invention.

Referring now to FIG. 4, an alternate embodiment of the voltage level converter circuit 10 (FIG. 1) may include one or more additional P-type devices 40 connected in series with primary P-type device 20. In this form of the invention the voltage at first output node 23 is limited to the "high" voltage level at input 22 minus the threshold voltage $V_{tp}$ of primary P-type device 20 and each of the additional P-type devices 40 connected in series with the primary P-type device. The number of P-type devices and threshold voltages of the P-type devices 20 and 40 may be chosen to produce the desired voltage level at first output node 23.

The circuit shown in FIG. 4 is identical to the circuit shown FIG. 2 except for the additional P-type device 40. The gate electrode of additional P-type device 40 is connected to the device drain electrode. Further additional P-type devices would also have their respective gate electrode connected to their drain electrode.

The operation of the circuit shown in FIG. 4 may be described starting from the condition in which the "low" first voltage level signal is applied to the input 22 and the voltage at first output node 23 also resides at the "low" level, which may be approximately zero volts. When the high going edge of a "high" level of the first voltage signal appears at the input 22, both N-type device 21 and the series connected P-type devices 20 and 40 conduct, allowing the voltage at first output node 23 to rise. The voltage at first output node 23 first reaches a point at which N-type device 21 becomes substantially non-conductive. Each of the P-type devices 20 and 40 continues to conduct until the voltage at their respective source electrode minus the voltage at the respective drain electrode is equal to the threshold voltage $V_{tp}$ of the particular device. Thus, for example, if the threshold voltage $V_{tp}$ for primary P-type device 20 is 0.4 volts and the threshold voltage $V_{tp}$ for additional P-type device 40 is 0.3 volts, primary P-type device 20 conducts until the voltage level at its drain electrode reaches 2.1 volts and additional P-type device 40 continues to conduct until the voltage level at its drain electrode, and first output node 23, reaches 1.8 volts.

The feedback arrangement 25 is more important in the embodiment of the voltage level converter circuit 10 shown in FIG. 4. The reason for this is that the voltage level at first output node 23 may reach a break point at which the voltage level increases relatively slowly to the desired second voltage level. However, by inverting the signal at first output node 23 with feedback inverter 29 and then feeding that signal back to bias feedback P-type device 30, the first output node is coupled directly to the second voltage supply $V_{dds}$. This direct coupling to the second supply voltage pulls the voltage level at first output node 23 more rapidly to the desired second voltage level.

The above described preferred embodiments are intended to illustrate the principles of the invention, but not to limit the scope of the invention. Various other embodiments and modifications to these preferred embodiments may be made by those skilled in the art without departing from the scope of the following claims.

We claim:

1. A circuit for converting a signal at a first voltage level to a signal at a second voltage level, the circuit comprising:
   (a) a primary P-type transistor having its source-drain conduction path connected between an input at which signals at the first voltage level are applied, and a first output node, and having its gate electrode connected to its drain electrode; and
   (b) an N-type transistor connected in parallel with the primary P-type transistor, the gate electrode of the N-type transistor connected to a second supply voltage at the second voltage level.

2. The circuit of claim 1 further comprising:
   (a) a feedback arrangement connected to the first output node.

3. The circuit of claim 2 wherein the feedback arrangement comprises:
   (a) a feedback inverter operating on the second supply voltage, and having an input connected to the first output node and a feedback inverter output; and
   (b) a feedback P-type transistor coupling the first output node to the second supply voltage and having its gate electrode connected to the feedback inverter output.

4. The circuit of claim 3 wherein the feedback arrangement further comprises:
   (a) a second inverter connected to the feedback inverter output, the second inverter operating on the second supply voltage.

5. The circuit of claim 1 wherein the first voltage level is approximately 2.5 volts and the second voltage level is approximately 1.8 volts.

6. The circuit of claim 1 further comprising:
   (a) at least one additional P-type transistor connected in series with the primary P-type transistor between the primary P-type transistor and the first output node, each additional P-type transistor having its gate electrode connected to its drain electrode.

7. A method for converting a signal at a first voltage level to a signal at a second voltage level, the method comprising steps of:
   (a) applying the signal at the first voltage level to the source electrode of a primary P-type transistor and at the drain electrode of an N-type transistor connected in parallel with the primary P-type transistor;
   (b) applying the voltage at the drain electrode of the primary P-type transistor to the gate electrode of the primary P-type transistor;
   (c) applying a second supply voltage at the second voltage level to the gate electrode of the N-type transistor.

8. The method of claim 7 further comprising the steps of:
   (a) inverting the drain electrode voltage of the primary P-type transistor with a feedback inverter operating on the second supply voltage; and
   (b) feeding the output of the feedback inverter to the gate electrode of a feedback P-type transistor, the feedback P-type transistor coupling the drain electrode of the primary P-type transistor to the second supply voltage.

9. The method of claim 7 wherein the first voltage level is approximately 2.5 volts and the second voltage level is approximately 1.8 volts.

10. The method of claim 7 further comprising the step of:
   (a) applying the voltage at the drain electrode of the primary P-type transistor to an additional P-type transistor connected in series with the primary P-type transistor; and
   (b) applying the voltage at the drain electrode of the additional P-type transistor to the gate electrode of the additional P-type transistor.

11. The method of claim 10 further comprising the steps of:
   (a) inverting the drain electrode voltage of the additional P-type transistor with a feedback inverter operating on the second supply voltage; and
   (b) feeding the output of the feedback inverter to the gate electrode of a feedback P-type transistor, the feedback P-type transistor coupling the drain electrode of the additional P-type transistor to the second supply voltage.

* * * * *